(12) United States Patent
Auvenshine et al.

(10) Patent No.: US 10,936,439 B2
(45) Date of Patent: *Mar. 2, 2021

(54) ASSIGNING STORAGE LOCATIONS BASED ON A GRAPH STRUCTURE OF A WORKLOAD

(71) Applicant: International Business Machines Corporation, Armonk, NY (US)

(72) Inventors: John J. Auvenshine, Tucson, AZ (US); Sunhwan Lee, Menlo Park, CA (US); James E. Olson, Oxford, CT (US); Mu Qiao, Belmont, CA (US); Ramani R. Routray, San Jose, CA (US); Stanley C. Wood, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 258 days.

This patent is subject to a terminal disclaimer.

(21) Appl. No.: 15/978,796

(22) Filed: May 14, 2018

(65) Prior Publication Data

US 2018/0267863 A1 Sep. 20, 2018

Related U.S. Application Data

(63) Continuation of application No. 15/095,209, filed on Apr. 11, 2016, now Pat. No. 10,007,580.

(51) Int. Cl.
*G06F 16/00* (2019.01)
*G06F 11/14* (2006.01)
(Continued)

(52) U.S. Cl.
CPC ........ *G06F 11/1464* (2013.01); *G06F 16/278* (2019.01); *G06F 16/7335* (2019.01);
(Continued)

(58) Field of Classification Search
CPC .................................................. G06F 16/7335
See application file for complete search history.

(56) References Cited

U.S. PATENT DOCUMENTS 8,812,653 B2 8/2014 Chandrasekaran
8,935,500 B1 1/2015 Gulati et al.
(Continued)

OTHER PUBLICATIONS

Bansal, et al., "Minimum Congestion Mapping in a Cloud", PODC '11, Jun. 6-8, 2011, San Jose, CA, Copyright 2011 ACM, 10 pages.
(Continued)

*Primary Examiner* — Ajith Jacob
(74) *Attorney, Agent, or Firm* — Daniel R. Simek

(57) ABSTRACT

A method for distributing data among storage devices. The method comprising one or more processors receiving a first graph workload that executes within a networked computing environment. The method further includes identifying data from the first graph workload that is utilized during the execution of the first graph workload that includes a plurality of data packets. The method further includes creating a first graph workload model representative of the graph structure of the first graph workload and determining two or more partitions that are representative of a distribution of the identified data utilized by the first graph workload based, at least in part, on the first graph workload model. The method further includes allocating a plurality of network accessible storage devices among the two or more partitions and copying a first set of data packets of the plurality of data packets to a network accessible storage device.

20 Claims, 4 Drawing Sheets

(51) Int. Cl.
*G06F 16/27* (2019.01)
*G06F 16/901* (2019.01)
*G06F 30/18* (2020.01)
*G06F 16/732* (2019.01)

(52) U.S. Cl.
CPC .......... *G06F 16/9024* (2019.01); *G06F 30/18* (2020.01); *G06F 2201/80* (2013.01)

(56) References Cited

U.S. PATENT DOCUMENTS

| | | |
|---|---|---|
| 8,954,381 B1 | 2/2015 | Naamad |
| 8,966,216 B1 | 2/2015 | Marshak et al. |
| 2004/0103189 A1 | 5/2004 | Cherkasova et al. |
| 2005/0075104 A1 | 4/2005 | Jain et al. |
| 2014/0089257 A1 | 3/2014 | Ignacio et al. |

OTHER PUBLICATIONS

Barzilay, Regina, "Graph-based Algorithms in NLP", MIT, Nov. 2005, 57 pages.

Quamar, et al., "SWORD: Scalable Workload-Aware Data Placement for Transactional Workloads", EDBT '13, Mar. 18-22, 2013, Genoa, Italy, Copyright 2013, ACM, 12 pages.

Sanders, et al., "High Quality Graph Partitioning*", Karlsruhe Institute of Technology, printed Apr. 6, 2016, 18 pages.

"Data Progression—The Industry's Only Proven Automated Tiered Storage", Compellent Technologies, Copynght 2011, printed Apr. 6, 2016, 4 pages.

"Adaptive Optimization for HP 3PAR StoreSery Storage, Hybrid storage on HP 3PAR StoreServ", HP, Technical white paper, Copyright 2012-2015 Hewlett-Packard Development Company, LP, printed Apr. 6, 2016, 21 pages.

U.S. Appl. No. 15/095,209, filed Apr. 11, 2016.

List of IBM Patents or Patent Applications Treated as Related (Appendix P), filed herewith.

ASSIGNING STORAGE LOCATIONS BASED ON A GRAPH STRUCTURE OF A WORKLOAD

BACKGROUND OF THE INVENTION

The present invention relates generally to the field of data processing, and more particularly with assigning storage locations for information resources utilized by a graph workload.

Advances in information technology (IT) enable individuals, organizations, enterprises, and agencies to access and process ever-increasing volumes of stored information. Unstructured data is not well suited for storage with well-known relational databases. Parsing and analyzing unstructured data for storage in a relational database consumes computing resources and can mask contextual references related to the generation of the unstructured data. In addition, some generated data is "data in motion," which is more valuable if not critical for decision making when utilized in real-time, such as weather forecasting or threat detection, as opposed after-the-fact or forensic analysis of an outcome based on the generated data.

Unstructured data can include numerous relationships that relate different portions or instances of the unstructured data as a web of interactions with other computing resources, files, and databases. In addition, software applications (i.e., applications), such as transaction processing, utilize data from many sources. In the example of transaction processing, a software application generates a workload that is comprised of other workloads that can be distributed within a networked computing environment. In this example, a transaction process can include workloads, such as analytics that provide fraud detection, certification of payment of the transaction by a financial institution, analytics of a merchant that can customize incentives for a customer engaged in the transaction, software of the merchant to receive and process the transaction of the customer, and queries to a shipping company to cost and schedule a delivery item associated with the transaction.

Some types of workloads can execute independently and directly return results, whereas other types of workloads are interdependent and can require data from one or more sources, and each source can execute additional workloads to obtain data required by a preceding workload. This web of relationships among workloads and data can be modeled by a graph structure, such as a graph database, where the data associated with a workload exists at nodes/vertices of a graph structure, and the relationships and interactions among data resources are described by edges of the graph structure that link nodes/vertices. A graph workload is defined as queries or analytics represented by a graph structure and data used for workload. Graph workloads and graph databases are useful for storing, traversing, and processing highly complex relationships. Graph workloads and graph databases can improve intelligence, predictive analytics, social network analysis, and decision and process management. Natural language processing (NLP) is another example of a graph workload.

In addition, graph workloads can execute within different IT (e.g., data processing) systems distributed among various locations that communicate via networks, such as enterprise systems, data centers, private cloud environments, and public cloud environments. Within an IT system, information and data can be stored on various types (e.g., storage tiers) of storage devices ranging from cheaper, slower (e.g., high latency) storage of a magnetic tape based system; to more expensive, fast non-volatile storage, such as solid-state disk drives; to faster volatile system based memory. Some forms and structures of data can readily be compressed to reduce storage requirements. Other data may utilize encryption software included on a storage device. Based on the performance requirements of a workload, data supporting the workload is stored in various storage tiers.

However, not all data is equal in terms of usage, cost sensitivity, and security/regulatory compliance. Some data accessed by a workload may be subject to specific controls for example, encryption and isolation based on a standard, such as ISO 27001:2013. Other data may be subject to Health Insurance Portability and Accountability Act (HIPAA) compliance regulations. Current solutions for modeling graph workloads, partitioning graph workloads, and assigning storage locations for data utilized by graph workloads do not incorporate the plurality of constraints (e.g., properties), such as networking delays, input/output (I/O) bandwidth, regulatory compliance, security, data compression ratios, workload interactions as well as know factors, such as cost and performance within a single solution.

SUMMARY

According to embodiments of the present invention, a method, computer program product, and a computer system is disclosed for distributing data among storage devices. The method receives a first graph workload that executes within a networked computing environment. The method identifies data from the first graph workload that is utilized during the execution of the first graph workload, where the identified data utilized by the first graph workload includes a plurality of data packets. The method creates a first graph workload model representative of a graph structure of the first graph workload. The method determines two or more partitions that are representative of a distribution of the identified data utilized by the first graph workload based, at least in part, on the first graph workload model. The method allocates a plurality of network accessible storage devices among the two or more partitions. The method copies a first set of data packets of the plurality of data packets to a network accessible storage device.

An embodiment of the present invention creates a first workload model representative of the graph structure of the first graph workload. The graph structure includes a plurality of nodes where a node is representative of one or more data packets of the identified data utilized during the execution of the first graph workload. One or more nodes of the plurality of nodes of the graph structure further includes metadata associated with the one or more data packets of the node. The included metadata of a node is also associated with one or more weight factors. In addition, the plurality of nodes of the graph structure representative of the first graph workload are linked by a plurality of edges. An edge of the graph structure is representative of a relationship between two nodes of the graph workload that are linked by the edge. The edge further includes metadata associated with the relationship between the two nodes and the included metadata of the edge is associated with one or more weight factors. The plurality of nodes and associated metadata, and the plurality of edges and associated metadata that link nodes are utilized to create the first graph workload model of the first graph workload.

In an embodiment of the present invention, the method further discloses the method assigns a first storage designation to a first partition of the two or more partitions that are representative of a distribution of the identified data utilized by the first graph workload. The method identifies one or more network accessible storage devices of the allocated plurality of network accessible storage devices that are allocated to the first partition. The method copies the first set of data packets to at least one of the one or more network accessible storage devices based on the first storage designation.

In an embodiment of the present invention, the method also identifies metadata associated with one or more sets of data packets included in the first partition. The method assigns the first storage designation to the first partition based, at least in part, on the identified metadata associated with the one or more sets of data packets of the first partition.

In an embodiment of the present invention, the method further discloses that the method identifies one or more changes to the first graph workload. The method utilizes the identified one or more changes to the first graph workload to predict a second graph workload. The second graph workload utilizes the plurality of data packets that includes a second set of data packets. The method copies the second set of data packets to one or more network accessible storage devices based, at least in part, on a second graph workload model that is associated with the second graph workload.

In an embodiment of the present invention, the method further discloses that the method identifies a second set of data packets of the first partition, where the second set of data packets includes metadata that corresponds to a security constraint. The method identifies a second storage designation of the first partition that supports the security constraint of the second set of data packets. The method copies the second set of data packets to another one or more network accessible storage devices of the first partition that are associated with the second storage designation.

In summary, embodiments of the present invention disclose a method, computer program product, and a computer system for distributing data utilized by a graph workload among network accessible storage devices. Embodiments of the present invention create a graph workload model for a graph work based on a graph structure that is representative of the data and relationships among the data of the graph workload and based on the graph workload model partitioning the data utilized by the graph workload.

Some embodiments of the present invention utilize metadata associated with the data utilized by a graph workload to create a more granular storage scheme than the prior art. Embodiments of the present invention partition a distribution of data utilized by the graph workload, allocate network accessible storage devices, and assign storage designations to the partitions of the graph workload. Whereas the prior art may include some metadata information, such as data usage to allocate and store data of a graph workload, embodiments of the present invention can create two or more storage designations for a partition and copy the data associated with each storage destination to one or more storage devices associated with the storage designation. In an example, an embodiment of the present invention identifies additional metadata associated with a portion of the data utilized by a graph workload that include constraints, such as security dictates. An embodiment of the present invention can: define a second storage designation for a partition based on a metadata constrain, identify one or more network accessible storage devices that support the constraint, and copy the data affected by the constraint to the second storage designation.

In addition, unlike the prior art, some embodiments of the present invention can also identify changes to one graph workload that predict a second graph workload and thereby identify a second graph workload model. Based on the second graph workload model, one or more network assessable storage devices are allocated, partitions and storage designation are determined, and data utilized by the second graph workload is copied to one or more storage devices associated with a storage designation; thereby eliminating the steps of creating a graph model and partitioning the graph model of the second graph workload.

DETAILED DESCRIPTION

Figure 1:
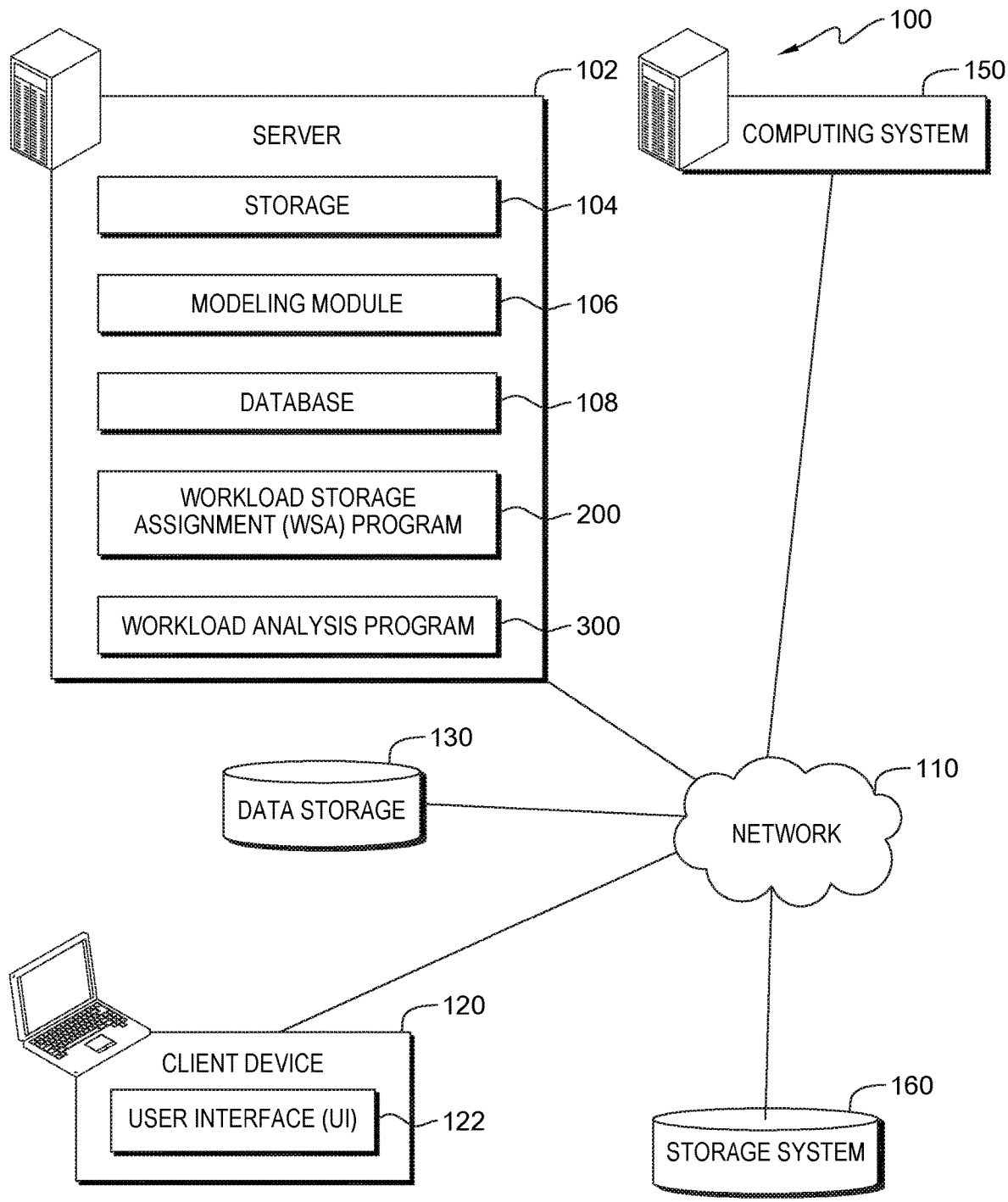
FIG. 1 illustrates a networked computing environment, in accordance with an embodiment of the present invention.

Embodiments of the present invention recognize that data is being generated at ever-increasing rates and with increasing levels of complexity. In addition, the success of enterprises, scientists, organizations, and government entities depends on obtaining and analyzing this data in a timely manner to make sound decisions and predictions. Structured data queries, unstructured data queries, data processing, analytics, cognitive learning, and any combination thereof can form the basis of a workload that is generated by an application (i.e., an app). Traditional enterprise data processing and data warehousing (EDW) environments are not keeping pace with the user demands for: self-service, increased agility, the inclusion of new data types, lower cost data processing solutions, and faster time-to-value. The architecture of an EDW is insufficient for efficiently processing modern workloads. A newer technology is a logical data warehouse (LDW) that utilizes a flexible architecture comprised of various hardware and software platforms and a data management infrastructure that dynamically configures the resources required to support a workload. Specific resources within an LDW can be more effective in performing portions of a workload than other resources. Computational portions of a workload can be directed to LDW resources with faster computer processors and more cache memory, structured queries can be directed to resources that include field programmable gate arrays to speed data filtering, and unstructured data can be directed to segments of the LDW optimized for unstructured data.

Embodiments of the present invention utilize a plurality of algorithms and software to model a graph workload. In one example, a graph workload is comprised of a plurality of nodes (i.e., vertices) linked by a plurality of edges. Each node or vertex represents an entity, such as data resources (e.g., data, information, files, databases, directories, etc.) and/or computational resources. In addition, each node may include one or more attributes (e.g., key-value pairs), labels that can contextualize the node, and metadata that can index and/or constrain the node. Nodes are linked by edges that represents relationships or edge values. Relationships may be identified by symbolic labels, such as "knows," "created by," etc., a direction (e.g., a start node and an end node), and/or a quantitative relationship, such as cost, a time interval, etc. A relationship can also be quantified by a calculated weight factor (WF) derived from metadata related to an edge. Some metadata associated with a graph workload is variable which, for example, can change over time, such as a rate of usage of a data resource. In another example, a WF of a node or an edge may vary in response to changes within a data processing environment, such as increases in network traffic based on aggregating results of complex queries. Other metadata and constraints associated with a graph workload are defined by a user or developer of an application, such as constraining the cost (e.g., limiting the resource allocation) associated with executing a graph workload.

Embodiments of the present invention utilize the plurality of entities of a graph workload, metadata related to each entity and relationship within the graph workload, and information associated with the data processing environment that executes the graph workload to model the graph workload. Embodiments of the present invention further analyze a modeled graph workload to determine two or more partitions to store data (e.g., data resources) utilized by the graph workload to improve performance. However, embodiments of the present invention do not limit the partitioning of data storage to storage tiers as does the prior art. Embodiments of the present invention model and/or partition a graph workload more granularly by including a plurality of constraints associated with the data processing environment during the execution of the graph workload. Partitions are representative of a distribution of the data utilized by a graph workload. Some embodiments of the present invention can assign storage designations or data and/or data resources based on various data structures, such as databases, tables, files, extents, records, data packets, frames, etc. Embodiments of the present invention further align data storage of a graph workload to storage designations within a partition, which can be as specific as a single storage device.

Various embodiments of the present invention obtain information from one or more elements of the data processing environment that executes a graph workload that includes: configuration information, status information, and/or constraints within the data processing environment. In some scenarios, embodiments of the present invention directly poll (e.g., query), via a physical or a virtual network, one or more elements of the data processing environment to obtain configuration information, status information, and/or constraints affecting the data processing environment. In other scenarios, embodiments of the present invention access an information repository that receives, via a physical or a virtual network, configuration information, status information, and/or constraints affecting a data processing environment from one or more elements of the data processing environment.

Embodiments of the present invention also include metadata associated with each workload type of a graph workload to model a graph workload. Graph workload types can be classified as filtering workloads, walking workloads, and working workloads. In some embodiments, a filtering workload utilizes information of a node, such as selecting data based on a single criterion. A walking workload utilizes information of edges (e.g., relationships) and information of nodes, such as identifying data of a first node and using a relationship of an edge to link to a second node to select additional data. A working workload utilizes information of nodes and edges and executes additional operations on the data. In a further embodiment, a working workload can be categorized by the complexity associated with the additional operations, and in some cases also categorized by the effort associated with the additional operations. In an example, a light-working workload compares (e.g., simple logical operator) values of a property of the identified data to a constant. In another example, a medium-working workload aggregates data based on one or more criteria or utilizes branched reasoning to select data. In yet another example, a heavy-working workload utilizes arbitrary analytics to obtain and compared data and/or parses a string of data to identify relevant information.

Alternative embodiments of the present invention can anticipate (e.g., predict) changes to a modeled graph workload and determine alternative storage designations for one or more entities (e.g., data resources) utilized during the execution of the predicted graph workload. Some alternative embodiments of the present invention analyze stored models of graph workloads to identify sub-workloads and their corresponding graph workload models. The analytics are used to create a database, cross references, or look-up tables used to identify existing models and storage designations associated with existing models. This simplifies the modeling of a graph workload when a new app with similar parameters executes.

Other alternative embodiments of the present invention utilize analytics to identify patterns among applications that utilize graph workloads to identify graph workload models that are utilized in a predictable manner, such as a pattern of use based on time. Another pattern of use that can predict a graph workload may be the execution of an application that utilizes some or all of the parameters of a previous execution but is executed by the other. An embodiment of the present invention may identify a pattern of use for a graph workload model based on decision tree analysis utilized during the development of a new app. In this embodiment, the decision tree analysis may identify sub-workloads that are identified for use during the execution of the new app, thereby simplifying the modeling of the workload generated by the new app. Some embodiments of the present invention may be provided to users "as-a-service" offering that initiates based on identifying an application of a subscriber that generates graph workload as opposed to initiating in response to identifying instances of the application executed by non-subscribers.

The present invention will now be described in detail with reference to the Figures. FIG. 1 is a functional block diagram illustrating networked computing environment 100 in an embodiment, in accordance with the present invention. In an embodiment, networked computing environment 100 includes: server 102, client device 120, data storage 130, computing system 150, and storage system 160 all interconnected over network 110. Many modifications to the depicted environment may be made by those skilled in the art without departing from the scope of the invention as recited by the claims. In various embodiments, networked computing environment 100 represents a data processing environment.

Server 102, data storage 130, computing system 150, and storage system 160 can be: laptop computers, tablet computers, netbook computers, personal computers (PC), desktop computers, or any programmable computer systems known in the art. In certain embodiments, server 102, data storage 130, computing system 150, and storage system 160 represent computer systems utilizing clustered computers and components (e.g., database server computers, application server computers, etc.) that act as a single pool of seamless resources when accessed through network 110, as is common in data centers and with cloud-computing applications. In general, server 102, data storage 130, computing system 150, and storage system 160 are representative of any programmable electronic device or combination of programmable electronic devices capable of executing machine-readable program instructions and communicating with a user of client device 120 via network 110. Server 102, data storage 130, computing system 150, and storage system 160 may include components, as depicted and described in further detail with respect to FIG. 4, in accordance with embodiments of the present invention.

Client device 120 may be: a laptop computer, a tablet computer, a netbook computer, a personal computer (PC), a desktop computer, a personal digital assistant (PDA), a smart phone, a wearable device (e.g., digital eyeglasses, smart glasses, a smart watch, etc.), or any programmable computer systems known in the art. In general, client device 120 is representative of any programmable electronic device or combination of programmable electronic devices capable of executing machine-readable program instructions and communicating with server 102, data storage 130, computing system 150, and storage system 160 via network 110. Client device 120 may include components, as depicted and described in further detail with respect to FIG. 4, in accordance with embodiments of the present invention.

Server 102 includes: storage 104, modeling module 106, database 108, workload storage assignment (WSA) program 200, and workload analysis program 300. In an embodiment, server 102 may also include various programs and/or databases, such as but not limited to: analytics, semantic, cognitive, and/or inferential reasoning programs; and a database management system (not shown). In various embodiment, server 102 can access one or more programs, functions, and/or software services from another computing system (not shown) via network 110. In an example, server 102 accesses, via network 110 a cloud service provider that provides one or more other software applications, such as analytics, cognitive, and/or machine learning programs as a Software as a Service (SaaS) offering. In some embodiments, server 102 is a virtual machine (VM) executing within another computing system of networked computing environment 100, such as computing system 150.

Storage 104 includes one or more, software applications, databases and/or file systems utilized by various embodiments of the present invention. For example, storage 104 includes but is not limited to: analytics, semantic, cognitive, and/or inferential reasoning programs; a database management system; and one or more webpages. Storage 104 may also include an operating system utilized by server 102. In one embodiment, storage 104 also includes one or more applications that utilize (e.g., generate) a graph workload. In another embodiment, storage 104 includes various user preferences; definitions utilized by modeling module 106, such programming languages and functions corresponding to graph workload types; and resource allocations for an application.

In an embodiment, storage 104 also includes a repository of configuration information received from one or more elements of networked computing environment 100, such as, network 110, one or more instances of computing system 150, and/or one or more instances of storage system 160. In an example, storage 104 includes dynamic and/or time-sensitive information that affects a graph workload, the modeling of the graph workload, the partitioning of the modeled graph workload, and/or the storage assignments (e.g., storage designations) for each partition and the storage assignments within a partition. Examples of such time sensitive information include: status information of a computing resource, network speed, and network connectivity information.

In some embodiments, storage 104 includes a list of partitions and associated storage designations of an executing graph workload. In other embodiments, storage 104 aggregates (e.g., buffers) the results of portions of a graph workload prior to communicating the result of a graph workload. In an example, storage 104 buffers the results of a graph workload prior to displaying the results of the graph workload to a user via UI 122. In various embodiments, server 102 transfers information associated with the execution of a modeled graph workload to an instance of database 108 upon completion of the modeled graph workload. Such information may include events that occurred within networked computing environment 100 during the execution of the modeled graph workload, and configuration information and/or status information of one or more elements of networked computing environment 100.

Modeling module 106 includes one or more methods, algorithms, and applications. Modeling module 106 includes, but is not limited to: geometric methods; spectral clustering methods; learning machine algorithms, such as decision tree analysis; an artificial neural network; and graph clustering algorithms, such as spectral clustering methods or algorithm METIS®. Modeling module 106 can execute one or more methods and/or programs recursively, in parallel, in series, or in any combination thereof.

In some embodiments, aspects of modeling module 106 are invoked during the execution of WSA program 200 and/or workload analysis program 300 to model a graph workload (e.g., create a model of a graph workload). Another aspect of modeling module 106 is invoked during the execution of WSA program 200 and/or workload analysis program 300 to partition data utilized by a modeled graph workload among storage locations based on dictates, constraints, and/or WFs included in metadata associated with a graph workload.

In one embodiment, modeling module 106 models a graph workload based on interactions (e.g., relationships, workload types, etc.) among data utilized by the graph workload. In an example, modeling module 106 receives information associated with a workload generated by an executing application and the graph workload utilizes a plurality of functions of the Gremlin programming language. Based on definitions stored in storage 104 and/or database 108, modeling module 106 can identify workload types based on Gremlin functions. Gremlin functions associated with a filtering workload type include Graph.v( ) and Graph.idx( ); functions associated with a walking workload type include OutV( ) and inE( ); and functions associated with a working workload type include Pipe.sort.v( ) and Pipe.mean( ).

In another embodiment, modeling module 106 partitions a modeled graph workload based on one or more criteria, metadata, and/or constraints (e.g., security). Partitioning a modeled graph workload includes identifying the one or more data resources utilized by the graph workload that are included in (e.g., assigned to) each partition. In other embodiments, aspects of modeling module 106 are invoked by workload analysis program 300 during or after the execution of a workload to determine whether: a modeled graph workload is optimally modeled, metadata weight factors affect a workload as anticipated; and proactively generate one or more additional models of a graph workload based on predicting one or more changes to a workload.

In various embodiments, modeling module 106 updates one or more algorithms utilized to partition a graph workload. In one example, modeling module 106 includes example algorithm to solve $Y_{ij}=f(X_i, X_j, t)$ where: $Y_{ij}$=an edge weight value, $X_i$=properties of node index i, $X_j$=properties of node index j, and t=time information. In one example, function $f$ is may be a linear function, such as a matrix math function. The $f$ function can be based on a training set of data input by one or more users and derived by one or more analytical functions executed by server 102. As database 108 is populated with modeled workload summaries that are analyzed (e.g., verified) by workload analysis program 300, server 102 can access and execute one or more machine learning algorithms, such as a support vector machine, that updates the $f$ function based on the modeling and partitioning information of modeled graph workloads stored in database 108.

In various embodiments, database 108 can be representative of a singular database, or instances of one or more databases. In one embodiment, an instance of database 108 is a database that include a listing (e.g., cross-reference) of the data and/or data resources, such as documents, images, spreadsheets, URLs, and other databases that are utilized by a graph workload. In another embodiment, another instance of database 108 includes information associated with data utilized (e.g., accessed, modified, created, deleted, etc.) by a graph workload. Information associated with the data utilized by a graph workload may include more granular information related to a data resource.

In some embodiments, another instance of database 108 may include a listing of graph workloads executed by various applications. This instance of database 108 may also include modeled graph workloads (i.e., workloads) for a workload. The modeled graph workloads may include models of sub-workloads of one or more workloads that are cross-referenced to include modeling dependencies, and include which sub-workloads are common to two or more graph workloads. The other instance of database 108 includes information associated with workloads, such as metadata input by a user, usage data derived by monitoring a data resource, workload types, security constraints, authentication protocols, and a repository of configuration information and/or status information obtained from one or more elements (e.g., computing resources) of networked computing environment 100.

In some embodiments, instances of database 108 include the configuration information of one or more elements of networked computing environment 100 based on a modeled workload summary. In other embodiments, instances of database 108 receive the configuration information of one or more elements of networked computing environment 100 from storage 104 based on events within networked computing environment 100 during the execution of the workload. In various embodiments, an instance of database 108 includes information based on modeled workload summaries (discussed in further detail with respect to WSA program 200).

In a further embodiment, database 108 includes look-up tables and cross-references of: modeled workloads, modeled graph workloads, storage designations, rules associated with selecting an alternate graph workload model, and applications based on analysis of a plurality of modeled workload summaries stored on an instance of database 108. In addition, an instance of database 108 may include the results of analytics used to identify one or more patterns of usage associated with a modeled graph workload, which is used to predict other occurrences of the modeled graph workload.

Data storage 130 represents a plurality of storage systems and/or storage devices that store the data resources, such as data, files, databases, webpages, etc. of a graph workload when the graph workload is not executing. In some embodiments, data storage 130 is one or more lower-level storage tiers of storage system 160.

Computing system 150 is one of the types of computing devices previously discussed. In an embodiment, one or more instances of computing system 150 respond to a workload, which, includes and/or generates one or more graph workloads, that is initiated by a user of client device 120 and instances of computing system 150 process the data of one or more storage locations (e.g., storage designation) assigned by WSA program 200 that is utilized by the workload. In one embodiment, computing system 150 represents a system or group of systems that executes within networked computing environment 100 and performs data processing. In some embodiments, one or more instances of computing system 150 are virtualized entities, such as VMs, executing within a computing device (e.g., server 102) of networked computing environment 100. In various embodiments, one or more instances of computing system 150 are included within public, private, and/or hybrid cloud data processing environments based on customer dictates, customer preferences, one or more compliance standard, and/or regulatory standards.

In one embodiment, storage system 160 is a system that is optimized for data storage, such as a network-attached storage (NAS) system, a storage area network (SAN), a SAN-NAS hybrid system. In addition, storage system 160 may utilize storage virtualization to enable additional functionality and more advanced features within the storage system. In another embodiment, an instance of storage system 160 is included in an instance computing system 150. In such an embodiment, storage system 160 may represent allocated, provisioned and/or virtualized hardware components, such as volatile memory, non-volatile memory, solid-state drives (SSDs), and hard-disk drives (HDDs).

In an alternative embodiment, storage system 160 is a cloud-based storage environment and storage system 160 is partitioned into public, private, and/or hybrid cloud storage environments. Storage system 160 can be further partitioned by hardware and/or software to provide one or more storage subsystems that are compliant to one or more standards/regulations (e.g., ISO 27001:2013). For example, storage system 160 may represent multiple virtual storage area networks (VSANs). VSANS can offer different high-level protocols such as FCP, FLIP, FICON®, iSCSI. Each VSAN is a separate self-contained fabric using distinctive security policies, zones, events, memberships, and name services.

In one embodiment, storage system 160 communicates to server 102, the configuration information and/or status information associated with one or more: storage environments, storage tiers, storage subsystems, and storage devices. Configuration information and/or status information of storage system 160 includes: available storage capacity, storage performance, communication protocols, software and/or on-device firmware for data compression and/or encryption, etc. Storage system 160 may also include: a data heat index mapping application, data compression/decompression software, encryption/decryption software, a database management system, a hardware storage module, etc. In addition, storage system 160 can monitor and communicate information related to data utilized by a workload, such as usage information, a heat index map, and changes to the data (e.g., added tables), etc.

In some embodiments, storage system 160 communicates configuration information, status information, and time sensitive information related to data utilized by a workload to storage 104 of server 102 for real-time use by WSA program 200 and/or workload analysis program 300. In other embodiments, storage system 160 communicates configuration information and information related to data utilized by a workload that is stored by in database 108 for subsequent use.

In some embodiments, storage system 160 includes hardware and software that enables storage system 160 to operate as one or more storage tiers. In an example, storage system 160 can include: SSDs (e.g., Tier-0 storage), high performance HDDs (e.g., Tier-1 storage), medium performance HDDs (e.g., Tier-2 storage), and/or low performance storage and/or archival media, such as backup magnetic tapes (e.g., Tier-3 storage). In another example, storage system 160 may include one or more other storage devices based on volatile and/or non-volatile memory components.

In a further embodiment, various instances of storage system 160 configure and/or allocate one or more tiers and/or one or more storage devices to store data utilized by a graph workload based on partition information, one or more storage designations (e.g., storage assignments), and data constraints/dictates received from WSA program 200 (discussed in further detail with respect to WSA program 200).

WSA program 200 is a program that receives a workload generated by an executing application. In one embodiment, WSA program 200 receives a workload of an executing application that includes one or more graph workloads. In another embodiment, WSA program 200 receives a graph workload that is a portion of another workload or another graph workload. In an example, WSA program 200 executes within a hybrid cloud environment and WSA program 200 can respond to one or more graph workloads executing within a private-cloud environment independently of one or more graph workloads executing within a public-cloud environment.

In some embodiments, WSA program 200 identifies data and/or one or more data resources that include the data utilized by a graph workload based on metadata associated with an executing application. In other embodiments, WSA program 200 identifies data and/or one or more data resources that include the data utilized by a graph workload based on information stored in database 108 this is related to an executing application.

In various embodiments, WSA program 200 identifies additional information that includes: metadata, relationships between data (e.g., data resources), user preferences, and/or constraints (e.g., dictates for data storage) for a graph workload. WSA program 200 interfaces with an instance and/or aspect of modeling module 106 to model a graph workload based on some aspects of the identified additional information. WSA program 200 interfaces with another instance and/or aspect of modeling module 106 to group data utilized by the graph workload model into two or more partitions based on other aspects of the identified additional information of the workload. WSA program 200 assigns a storage designation to data within a partition.

In a further embodiment, WSA program 200 may define additional storage designations to a partition based on metadata associated with the data. In an example, WSA program 200 defines two storage designation for a partition that utilizes SSDs to store data. WSA program 200 defines a storage designation for data that changes frequently during a graph workload (e.g., write intensive data), and a storage designation for data that is accessed frequently but remains unchanged (e.g., read intensive data). In an embodiment, WSA program 200 communicates the two or more storage designations to various elements of networked computing environment 100 to provision and/or allocate storage devices for the two or more storage designations of data utilized by an executing workload. In addition, WSA program 200 initiates to transfer (e.g., copy) the data and/or data resources stored in data storage 130 to the dictated storage designations of the modeled graph workload.

Workload analysis program 300 is a program that analyzes a modeled workload. In one embodiment, workload analysis program 300 predicts the occurrence of a graph workload based on determining information associated with: an executing application, changes to configuration and/or status information for one or more elements of a networked computing environment, and metadata associated with the data and/or data resources utilized by the executing application. In response to predicting a graph workload, workload analysis program 300 retrieves a model of the graph workload and implements a graph workload by using information associated with the model to allocate and assign storage designations for the executing application within the networked computing environment.

In some embodiments, workload analysis program 300 analyzes a modeled workload as opposed to predicting a modeled workload. A modeled workload can be: a monolithic modeled graph workload, a modeled graph sub-workload of a workload, and a workload comprised of a plurality of graph workloads and non-graph workloads. Non-graph workloads can be identified as filtering type workloads with a low edge WF with respect to modeling and inclusion within a partition. In one embodiment, workload analysis program 300 analyzes a modeled workload based on a modeled workload summary produced by WSA program 200. In another embodiment, workload analysis program 300 analyzes a modeled workload based on one or more changes associated with executing an application. In some scenarios, workload analysis program 300 analyzes a modeled workload based on changes within networked computing environment 100 that includes the resources (e.g., hardware, software, and data) utilized by the executing application. In other scenarios, workload analysis program 300 modifies information associated with a modeled workload based on input from a user that executes the application that utilizes the modeled workload.

In various embodiments, workload analysis program 300 executes one or more aspects of modeling module 106 and may update a modeled graph workload based on various, changes of metadata, changes within networked computing environment 100, one or more rules stored in database 108, and input from a user. In one scenario, workload analysis program 300 updates (e.g., replaces) a modeled graph workload stored in database 108. In another scenario, workload analysis program 300 stores the updated modeled graph workload as an alternative model for a graph workload of an application. In various scenarios, workload analysis program 300 communicates with a user via UI 122 to obtain input from a user to identify a modeled graph workload as a "primary" model and one or more other modeled graph workloads are identified as "alternative" models. In a further embodiment, workload analysis program 300 can combine one or more modeled graph workloads of an application into a modeled workload or a modeled monolithic workload.

In one embodiment, client device 120, computing system 150, and storage system 160 communicate through network 110 to server 102. Network 110 may also connect server 102 to one or more elements of networked computing environment 100 to obtain configuration information and/or status information of the one or more elements of networked computing environment 100. In another embodiment, client device 120 communicates with one or more other computing systems (e.g., computing system 150) and/or computing resources, such as a web server, IT system manager, etc. (not shown) via network 110. In some scenarios, network 110 communicates configuration information and status information to server 102 for a real-time user. In other scenarios, network 110 communicates configuration information and status information to server 102 for future analysis and/or use.

In some embodiments, network 110 communicates configuration and/or network status information to server 102 (e.g., storage 104) from one or more elements of network 110. For example, configuration information and/or status information of network 110 can include: firewall status, I/O bandwidth of a network node, connectivity resources within networked computing system 100, etc. In an example, network 110 can identify to WSA program 200, via server 102 that an instance of storage system 160 is not accessible via network 110 and WSA program 200 models a graph workload based on excluding that instance of storage system 160.

Network 110 can be, for example, a local area network (LAN), a telecommunications network, a wireless local area network (WLAN), such as an intranet, a wide area network (WAN), such as the Internet, or any combination of the previous and can include wired, wireless, or fiber optic connections. In general, network 110 can be any combination of connections and protocols that will support communications between server 102, client device 120, computing system 150, and storage system 160, in accordance with embodiments of the present invention. In various embodiments, network 110 operates locally via wired, wireless, or optical connections and can be any combination of connections and protocols (e.g., personal area network (PAN), near field communication (NFC), laser, infrared, ultrasonic, etc.).

In some embodiments, an instance of network 110 is a virtual LAN (VLAN) that connects two or more virtualized entities within a virtualized portion (not shown) of networked computing environment 100. In an example, a computing system (not shown) of networked computing environment 100 is virtualized to include multiple VMs such as server 102, one or more instances of computing system 150, and an instance of storage system 160 interconnected via a VLAN implementation of network 110. In this example, aspects of the present invention can be deployed within one computing system and various VMs and virtual storage devices can be provisioned and/or configured to optimize the data processing, data storage, based on the associated metadata and constraints associated with a graph workload.

In one embodiment, client device 120 is a computing device of a user. Client device 120 can include: user interface (UI) 122 and various programs and electronic files (not shown). Examples of types of programs that client device 120 can include are: a web browser, a file manager, and an office productivity suite of programs (e.g., a word processor, a graphics program, a spreadsheet program, an e-mail program, etc.). In another embodiment, client device 120 can be a terminal that is included in server 102.

In one embodiment, UI 122 may be a graphical user interface (GUI) or a web user interface (WUI) and UI 122 can display text, documents, spreadsheets, graphs, user options, application interfaces, and instructions for operation, and include the information, such as graphic, text, and sound that a program presents to a user. In an example, UI 122 enables a used to access database 108 to input and/or modify metadata and WFs associated with a graph workload and/or the data resources utilized by the graph workload. In various embodiments, UI 122 displays one or more icons representing applications that a user can execute, which in turn generate a graph workload. In addition, UI 122 can control sequences/actions that the user employs to respond and/or validate queries of workload analysis program 300.

In some embodiments, a user of client device 120 can interact with UI 122 via a singular device, such as a touch screen (e.g., display) that performs both input to a GUI/WUI, and as an output device (e.g., a display) presenting a plurality of icons associated with apps and/or images depicting one or more executing applications. In other embodiments, an application (e.g., a web browser) can generate UI 122 operating within the GUI environment of client device 120.

Figure 2:
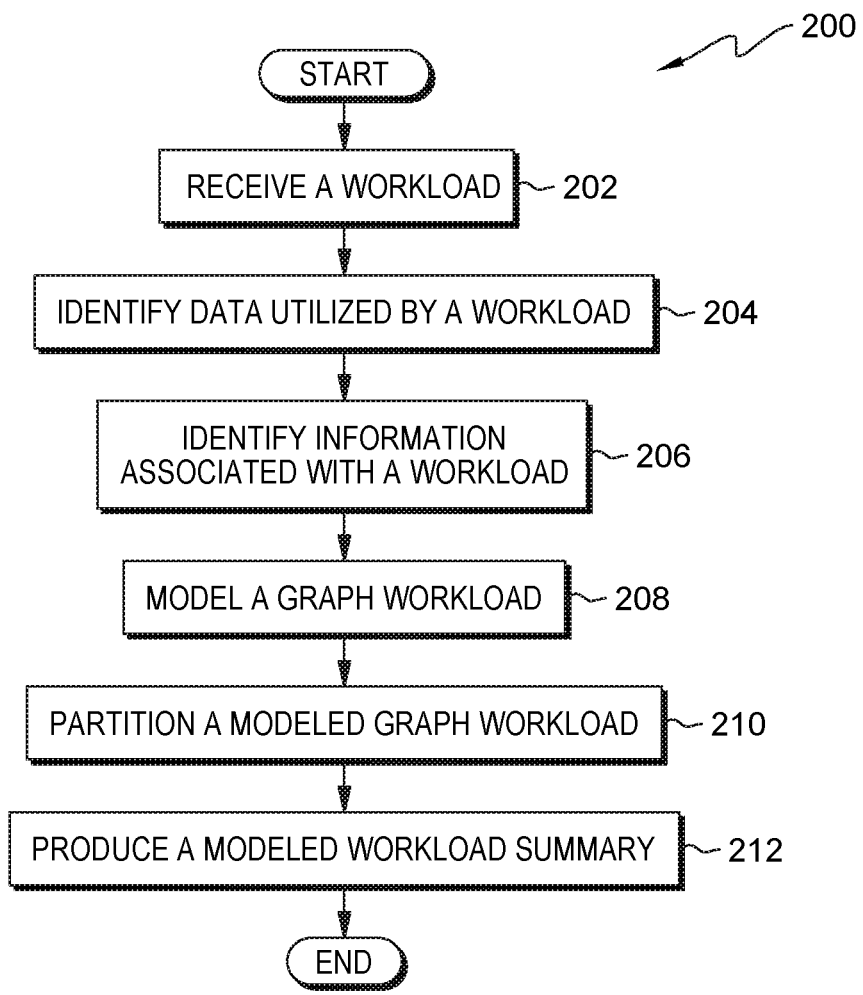
FIG. 2 depicts a flowchart of the steps of a workload storage assignment (WSA) program executing within the networked computing environment of FIG. 1, for determining storage assignments of data resources utilized during the execution of a graph workload based on modeling and partitioning the graph workload, in accordance with an embodiment of the present invention.

FIG. 2 is a flowchart depicting operational steps for WSA program 200, a program that executes within networked computing environment 100, models a workload, and partitions a workload based on one or more criteria, in accordance with embodiments of the present invention. In addition, WSA program 200 determines (e.g., aligns) storage assignments for data resources utilized by the graph workload. In some embodiments, multiple instances of WSA program 200 can execute concurrently. In one such embodiment, one instance of WSA program 200 generates a preliminary model and partitions the preliminary model of a graph workload, and one or more other instances of WSA program 200 further models, partitions, and determines storage assignments of data resources of one or more of the preliminary partitions. In other embodiments, one or more instances of WSA program 200 and workload analysis program 300 execute concurrently.

In various embodiments, WSA program 200 produces a summary of a modeled workload. A summary of a modeled workload includes, but is not limited to, parameters of an application that generates a graph workload, configuration information utilized to model and partition a workload, identification of each node (e.g., data resource) and edge (e.g., relationship) within a partition, and one or more storage assignments for each data resource.

In step 202, WSA program 200 receives a workload. In one embodiment, WSA program 200 receives a workload of an application (not shown) that executes within networked computing environment 100. WSA program 200 processes a workload that is or includes a graph workload. WSA program 200 may receive a workload that includes and/or generates one or more other graph workloads. In another embodiment, WSA program 200 receives a graph workload that is a portion of another workload. In an example, WSA program 200 executes within a hybrid cloud environment and WSA program 200 responds to one or more graph workloads executing within a private-cloud environment independent of one or more graph workloads executing within a public-cloud environment.

In some embodiments, WSA program 200 receives a workload of an application based on input of client device 120. In one example, WSA program 200 receives a graph workload of an application that executes on client device 120. In another example, WSA program 200 receives a graph workload of an application stored in storage 104 that a user of client device 120 initiates via UI 122. In other embodiments, WSA program 200 receives a workload of another application executing on another computing device (not shown) within networked computing environment 100. In an example, WSA program 200 receives a graph workload from an application that initiates based on a trigger, such as time, a detected threat, or an indication received from a different application. In various embodiments, WSA program 200 receives additional information from an application that initiates a graph workload (discussed in further detail with respect to step 206).

In a further embodiment, WSA program 200 execute concurrently with workload analysis program 300. In such an embodiment, if WSA program 200 receives an indication from workload analysis program 300 that the executing application is associated with a previously modeled workload and/or a predicted workload, WSA program 200 can terminate and transfer the execution of the graph workload to workload analysis program 300. In an alternative embodiment, WSA program 200 executes and receives a workload of a user that subscribes to WSA program 200.

In step 204, WSA program 200 identifies data utilized by a workload. In one embodiment, WSA program 200 identifies data and/or one or more data resources (e.g., files, databases, etc.) that include data utilized during the execution of a graph workload based on information received from the executing application that generates the graph workload. In another embodiment, WSA program 200 identifies one or more data resources utilized by a graph workload based on stored information (e.g., a list, a cross-reference, a database). In an example, WSA program 200 initiates a query to database 108 that identifies the executing application and information associated with the execution of the application, such as parameters of a transaction. WSA program 200 receives a response to the query from database 108 that identifies the one or more data resources utilized by the graph workload of the executing application.

In some embodiments, WSA program 200 analyzes one or more application program interface (API) calls associated with the executing application and/or one or more other workloads generated by the graph workload to identify the one or more data resources utilized by the graph workload. In other embodiments, WSA program 200 queries database 108 to determine whether the executing application produced a modeled workload summary (discussed in further detail with respect to step 212) during a previous execution of the application. WSA program 200 receives a response to the query from database 108. If the executing application previously produced a modeled workload summary, then WSA program 200 identifies one or more data resources utilized by the graph workload generated by the executing application, or alternatively, WSA program 200 utilizes one of the embodiments previously discussed to identify data utilized by the graph workload.

In step 206, WSA program 200 identifies information associated with a workload. Information associated with workloads includes: metadata input by a user, usage data related to each data resource, workload types, and configuration information and/or status information obtained from one or more elements of networked computing environment 100. In an embodiment, some metadata is determined by another application, such as usage metadata determined by a data heat mapping application executing on storage system 160. Other metadata may be included with data when the data is generated by another application. In one embodiment, WSA program 200 parses and/or analyzes metadata input by a user and identifies WFs associated with one or more data resources and/or workloads of a graph workload that is utilized to model a graph workload (discussed in further detail with respect to step 208). In addition, WSA program 200 analyzes the information associated with the graph workload to identify one or more constraints associated with one or more data resources utilized by the graph workload. Constraints associated with a data resource can include: storage device level encryption, encryption during network communications, data compression, and security/compliance dictates. In some scenarios, WSA program 200 stores the metadata and constraints of a graph workload and data utilized by the graph workload in-memory on server 102. In other scenarios, WSA program 200 stores the metadata and constraints of a graph workload and the data utilized by the graph workload, in storage 104 of server 102.

In another embodiment, WSA program 200 queries database 108 to obtain metadata and/or WFs associated with one or more data resources that are common among one or more graph workloads and/or applications. In some embodiments, WSA program 200 receives a response from database 108 that identifies one or more differences within the metadata received from an application and an analysis of another graph workload generated by a previous execution of workload analysis program 300. In one scenario, WSA program 200 utilizes one or more rules included in database 108 to determine whether to utilize the metadata of the current instance of a graph workload, or to utilize historical metadata of the graph workload stored in database 108. In another scenario, WSA program 200 communicates with a user of client device 120 and identifies the one or more differences in the metadata to the user. WSA program 200 receives a response, input via UI 122 by the user that identifies the metadata for use with the current execution of a graph workload.

In a further embodiment, WSA program 200 obtains configuration information and/or status information associated with one or more elements of networked computing environment 100. In some scenarios, WSA program 200 queries server 102 to obtain configuration information and/or status information received from one or more elements of networked computing environment 100 and stored in storage 104. In another scenario, WSA program 200 actively polls one or more elements of networked computing environment 100 to obtain configuration information and/or status information of the one or more elements of networked computing environment 100.

In step 208, WSA program 200 models a graph workload. Modeling of a graph workload can include: identifying the data utilized by the graph workload (e.g., nodes), identifying relationships between data (e.g., edges, direction of interaction), and programs and commands utilized process (e.g., sort, extract, calculate, modify, etc.) the data of the graph workload. Modeling of a graph workload can also include determining a weight (e.g., strength) for a relationship between nodes.

In one embodiment, WSA program 200 utilizes one or more aspects of modeling module 106 to model a graph workload (e.g., create a model of a graph workload). WSA program 200 aggregates metadata and constraints of a graph workload and data (e.g., data resources) utilized by the graph workload from: in-memory storage on server 102, storage 104 of server 102, and/or from the results of a query of database 108 and WSA program 200 communicates the metadata and constraints to modeling module 106. In another embodiment, WSA program 200 includes additional information, such as graph workload types of sub-workloads of a graph workload, and configuration information and status information from one or more elements of networked computing environment 100 to modeling module 106. Subsequently, WSA program 200 receives one or more graph workload models from modeling module 106. In some embodiments, WSA program 200 stores a graph workload model in database 108 prior to partitioning the graph workload model.

In step 210, WSA program 200 partitions a modeled graph workload. In one embodiment, WSA program 200 communicates metadata associated with the data resources utilized by the modeled graph workload to modeling module 106. WSA program 200 utilizes one or more aspects of modeling module 106, such as a spectral clustering algorithm or METIS, to partition a modeled graph workload into two or more partitions based on the communicated metadata associated with the data resources utilized by the modeled graph workload. WSA program 200 identifies the one or more data resources utilized by the graph workload that is associated with each partition. In an example, WSA program 200 determines a plurality of edge weights based on the WFs of metadata associated with the edges of the modeled graph workload. In addition, WSA program 200 determines the vertex weights based on the WFs of metadata associated with nodes of the modeled graph workload. WSA program 200 communicates the edge weights and vertex weights to modeling program 106, which may partition the modeled graph workload by clustering nodes linked by higher edge weights and identifying a portion of a partition boundary based on a low edge weight link.

In another embodiment, WSA program 200 may execute a second instance of modeling module 106, and include data constraints such as a security or compliance dictate to reanalyze the two or more partitions of the modeled graph workload. In one example, WSA program 200 communicates an indication to modeling module 106 to reduce storage costs of data that includes a security or compliance constraint. WSA program 200 receives another set of partitions from modeling module 106 that creates a new partition and/or group of storage assignments based on dictating that most or all of the data resources included in the new partition include the security or compliance constraint. WSA program 200 defines another storage designation for the new partition and/or group of storage assignments. In another example, WSA program 200 indicates to modeling module 106 to minimize networking delay but permit an increase storage costs. WSA program 200 receives another set of partitions from modeling module 106 that combines one or more partitions that include data with similar a security or compliance constraints.

In a further embodiment, WSA program 200 communicates with one or more elements of networked computing environment 100, such as storage system 160 to dictate: a configuration, a storage designation, and/or dictate the allocation of one or more storage devices based on criteria and constraints associated with the partitions of the modeled graph workload and one or more data resources of a modeled graph workload. In an example, WSA program 200 communicates with storage system 160 to identify, based on configuration information, which storage devices within a storage tier support on-device data compression/decompressions. WSA program 200 utilizes the configuration information of storage system 160 to assign storage designations for data within a partition that utilizes data compression, to storage devices that are identified to include on-device data compression/decompression.

In various embodiments, in response to WSA program 200 partitioning a modeled graph workload and assigning storage designations for the data resources (e.g., data) of the modeled graph workload, WSA program 200 initiates to copy data resources from data storage 130 and distributes the copied data resources among a plurality of storage devices of networked computing environment 100 based on the storage designation assigned to each data resource.

In step 212, WSA program 200 produces a modeled workload summary. In some embodiments, WSA program 200 delays the production of a modeled workload summary until the execution of the modeled workload completes so that WSA program 200 can obtain information associated with one or more elements of networked computing environment 100 to include in a modeled workload summary. In one embodiment, WSA program 200 stores a modeled graph workload summary as a set of hierarchically organized tables within an instance of database 108. WSA program 200 analyzes each partition of the modeled graph workload to identify and aggregate information related to each storage assignment of a corresponding data resource. In one example, WSA program 200 organizes a modeled workload based on: an indication corresponding to an application; partitions that comprise the modeled workload; one or more graph workloads (e.g., sub-workloads) within each partition; one or more data resources of a graph workload; a storage designation for each data resource; and metadata associated with the application and data resources that are used to model the workload and associated graph workloads.

In another embodiment, WSA program 200 includes (e.g., stores) information associated with one or more elements of networked computing environment 100, such as configuration information and/or status information in another table of database 108. In one instance, WSA program 200 stores the information associated with one or more elements of networked computing environment 100 at the initiation of a workload by an application. In another instance, WSA program 200 stores the information associated with one or more elements of networked computing environment 100 at the modeling and execution of a workload of an application.

In some embodiments, WSA program 200 communicates with one or more system management programs (not shown), such as a hypervisor of computing system 150 and/or a storage manager of storage system 160 to determine: the computing resources consumed, usage rates for one or more data resources, and networking information (e.g., bandwidth) during the execution of the modeled workload and/or individual partitions of the modeled workload. WSA program 200 may store the determined information in database 108. WSA program 200 may alternatively store the determined information in storage 104 for subsequent analysis (discussed in further detail with respect to workload analysis program 300). In various embodiments, the information obtained by WSA program 200 from one or more system management programs and included in a modeled workload summary is utilized to verify the WF and constraints used to model graph workloads.

In summary, various embodiments of the invention improve the granularity of identifying storage designations (e.g., smart storage alignment) for the plurality of data (e.g., data resources) utilized by a graph workload by modeling the graph workload based on graph structures. Further embodiments can utilize graph structures to partition the modeled graph workload to align storage capacity utilized by the graph workload as opposed to the prior art that utilizes heat mapping, automated storage tiering, etc. The improved granularity provided by embodiments of the invention to identify storage designations for data utilized by a graph workload also reduces the cost of storing data while ensuring security and regulatory compliance for portions of the data constrained by such requirements (dictates). In addition, embodiments of the invention can operate seamlessly between various computing environments such as a hybrid cloud. A further embodiment can produce a modeled workload summary that can be further analyzed and utilized to improve graph workload models, and in the case of workload analysis program 300 can predict an occurrence of a modeled graph workload.

Figure 3:
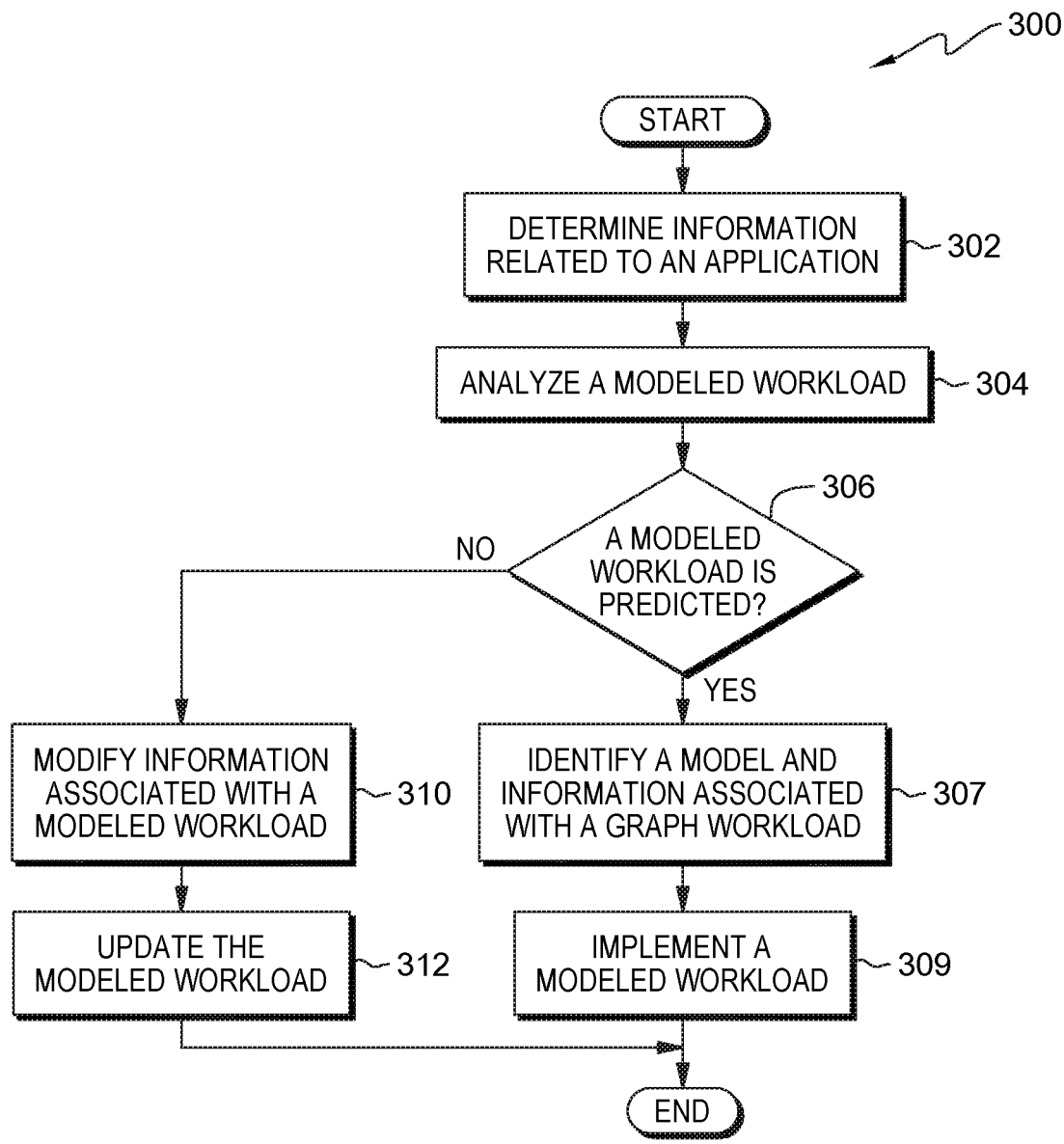
FIG. 3 depicts a flowchart of the steps of a workload analysis program executing within the networked computing environment of FIG. 1, for modifying a model of a graph workload and/or predicting a model for a graph workload based on a change associated with the software application that generates the graph workload, in accordance with an embodiment of the present invention.

FIG. 3 is a flowchart depicting operational steps for workload analysis program 300, a program for analyzing a modeled workload, in accordance with embodiments of the present invention. In one embodiment, workload analysis program 300 predicts the occurrence of a graph workload. In response to predicting a graph workload, workload analysis program 300 retrieves a model of the graph workload and implements the graph workload by using information associated with the model to allocate and assign storage designations within the networked computing environment. In some embodiments, workload analysis program 300 analyzes a modeled workload based on a modeled workload summary produced by WSA program 200. In other embodiments, workload analysis program 300 analyzes a modeled workload based on one or more changes associated with executing an application and/or changes within a networked computing environment, such as networked computing environment 100, which includes the resources (e.g., hardware, software, and data) utilized by the executing application/workloads.

In step 302, workload analysis program 300 determines information related to an application. In one embodiment, workload analysis program 300 executes concurrently with an application that utilizes and/or generates one or more graph workloads during the execution of the application. Workload analysis program 300 queries database 108 and retrieves a modeled workload summary associated with the executing application. Workload analysis program 300 determines from the retrieved modeled workload summary: metadata associated with the data utilized by the executing application, one or more configurations associated with elements of the networked computing environment, and one or more modeled graph workloads utilized by the executing application. Workload analysis program 300 further determines WFs related to the metadata that are utilized by modeling module 106 to model graph workloads.

In some embodiments, workload analysis program 300 identifies additional information associated with the execution of the application, such as a level of priority, one or more cost constraints, and one or more inputs. In some instances, workload analysis program 300 identifies information, input via UI 122 from a user, which is used by an application to execute a modeled workload. An example of information input by a user is provisioning information associated with one or more VMs that execute a modeled workload. In various embodiments, monitoring program 300 identifies configuration and/or status information for one or more elements of networked computing environment 100 utilized during the execution of the modeled workload. In some scenarios, workload analysis program 300 identifies configuration and/or status information for one or more elements of networked computing environment 100 utilized during the execution of the modeled workload by polling the one or more elements. In some scenarios, monitoring program 300 identifies configuration and/or status information for one or more elements of networked computing environment 100 utilized during the execution of the modeled workload by querying server 102 receiving the information configuration and/or status information stored in storage 104.

In step 304, workload analysis program 300 analyzes a modeled workload. In one embodiment, workload analysis program 300 analyzes a modeled workload to identify whether the workload was previously modeled, and if so, workload analysis program 300 queries (e.g., cross-references) database 108 to identify one or more graph workloads and/or modeled sub-workloads that are associated with the modeled workload. Based on identifying at least one modeled workload or sub-workload among the results of the query, workload analysis program 300 predicts a modeled workload or a sub-workload.

In another embodiment, workload analysis program 300 executes concurrently with WSA program 200. Workload analysis program 300 analyzes (e.g., compares) metadata and WFs of a retrieved modeled workload summary with respect to the metadata and WFs of a currently executing workload. In some scenarios, workload analysis program 300 buffers the results of the analysis on server 102. In other scenarios, workload analysis program 300 stores the results of the analysis within storage 104.

In an alternative embodiment, workload analysis program 300 executes off-line to analyze a plurality of modeled workloads, modeled graph workloads, and applications stored in database 108. Workload analysis program 300 may analyze information stored in database 108 to identify: common data resources, common modeled graph workloads, and patterns of use of one or more modeled graph workloads. In an embodiment, workload analysis program 300 utilizes supervised machine learning to identify patterns of use of a modeled graph workload to predict an occurrence of the modeled graph workload and/or conditions that trigger the occurrence of the modeled graph workload.

In decision step 306, workload analysis program 300 determines that a modeled workload is predicted. In one embodiment, workload analysis program 300 determines that a modeled workload is predicted based on identifying a workload and/or application that executes when one or more known conditions occur. For example, time may be the known condition for a specific application, such as a payroll application, which executes at specific times. Workload analysis program 300 can interface with a calendar function of server 102 to determine which instance and/or parameters (e.g., metadata) is associated with an application prior to the execution of the application. For example, workload analysis program 300 determines (e.g., predicts) from the calendar function whether a monthly, quarterly, or yearly payroll workload executes on a specific calendar date.

In some embodiments, workload analysis program 300 determines that a modeled workload is predicted based on an analysis of a workload (step 304). In these embodiments, an instance of workload analysis program 300 executes concurrently with one or more instances WSA program 200. Workload analysis program 300 controls the execution of the one or more instances of WSA program 200. Workload analysis program 300 queries database 108 and determines that the graph workload of an executing application is comprised of sub-workloads. WSA program 300 utilizes one or more analytic/cognitive programs and/or additional queries of database 108 to determine which sub-workloads of the executing application are predicted and which sub-workloads are not predicted. WSA program 300 further determines whether sub-workloads are modeled independently and which sub-workloads are modeled in combination. In an example, workload analysis program 300 utilizes a decision tree algorithm to predict which sub-workloads of the executing application can be modeled independently.

In other embodiments, workload analysis program 300 determines that a modeled workload is not predicted based on workload analysis program 300 identifying one or more indications. In one example, workload analysis program 300 receives an indication from WSA program 200 that a new workload is modeled and that a modeled workload summary is analyzed by workload analysis program 300 (step 304). In another example, workload analysis program 300 determines that a modeled workload is not predicted based on indications associated with analyzing configuration information and/or status information (e.g., in storage 104) from networked computing environment 100, such as determining that one or more storage resources use by a modeled work is not available.

In one embodiment, responsive to determining that sub-workloads of the executing application can be modeled independently, one or more instances of workload analysis program 300 process the predicted sub-workloads that can be modeled independently (Yes branch, decision step 306) and one or more instances of WSA program 200 process the sub-workloads that are not predicted and/or cannot be modeled independently.

Responsive to determining that a modeled workload is predicted (Yes branch, decision step 306), workload analysis program 300 identifies a model for a workload (step 307).

In step 307 workload analysis program 300 identifies a model and information associated with a graph workload. In one embodiment, workload analysis program 300 identifies a model for a workload based on information associated with the determined state of an application (which was determined in step 302). Workload analysis program 300 utilizes the state information associated with a workload to query database 108 and identify modeled workload summaries of graph workloads stored on database 108 that correspond to the application and the state of the application. In an example, workload analysis program 300 identifies the modeled graph workloads of predicted workload. In another example, workload analysis program 300 utilizes analytics to identify one or more sub-workloads included in predicted workload that are modeled graph workloads.

In step 309, workload analysis program 300 implements a modeled workload. To implement a modeled workload, workload analysis program 300 retrieves one or more modeled graph workloads and information associated with the one or more modeled graph workloads from database 108. Workload analysis program 300 utilizes the information that predicted an occurrence of a modeled workload, "Yes" branch of decision step 306, to retrieve the one or more models and associated information from database 108.

In another embodiment, workload analysis program 300 further analyzes the retrieved information, from database 108, to identify one or more partitions for the modeled graph workload and the storage designations for the data and/or data resources that are associated with the modeled workload. Workload analysis program 300 determines the locations and storage tiers dictated for various storage designations based on the modeled graph workload. Workload analysis program 300 communicates the storage information, via network 110, to one or more elements of networked computing environment 100, such as storage system 160 so that the one or more elements of networked computing environment 100 can allocate (e.g., provision) the dictated storage designations. In addition, workload analysis program 300 utilizes information related to the application to identify the data and/or data resources that are utilized by the modeled graph workload. Workload analysis program 300 initiates the transfer (e.g., copy, preload) the data and/or data resources stored in data storage 130 to the dictated storage designations within networked computing environment 100 for the modeled graph workload.

Still referring to step 309, in an alternative embodiment, workload analysis program 300 queries storage 104 to identify configuration and/or status information for one or more elements of networked computing environment 100. Workload analysis program 300 compares the identified configuration information and/or status information of networked computing environment 100 to the configuration information and/or status information for the modeled graph workload to determine whether the modeled graph workload can be implemented as modeled. In one instance, if workload analysis program 300 determines that a modeled graph workload cannot be implemented as modeled, then workload analysis program 300 initiates (e.g., activates) modeling module 106 to reconfigure the modeled graph workload based on the configuration information and/or status information from the query of storage 104.

In another instance, workload analysis program 300 queries database 108 to determine whether a modeled graph workload includes a list of alternative models or alternative storage designations for a modeled graph workload. If workload analysis program 300 determines that database 108 includes a list of alternative storage designations, then workload analysis program 300 implements a modeled workload based on the configuration information and/or status information and the list of alternative models or alternative storage locations. Otherwise, workload analysis program 300 initiates an instance of WSA program 200, transfers the information and metadata of the graph workload to the initiated instance of WSA program 200, and then workload analysis program 300 aborts.

Referring to decision step 306, responsive to determining that a workload is not predicted (No branch, decision step 306), workload analysis program 300 modifies information associated with a modeled workload (step 310).

In step 310, workload analysis program 300 modifies information associated with a modeled workload. Workload analysis program 300 retrieves metadata information and WFs of a modeled workload that is buffered on server 102 and/or stored in storage 104. In one embodiment, workload analysis program 300 modifies information associated with a modeled workload of the application. In another embodiment, workload analysis program 300 modifies information associated with graph workload (e.g., a sub-workload) of a modeled workload. In some embodiments, workload analysis program 300 communicates with a user of client device 120 to obtain an indication from the user with respect to one or more modifications of information related to a modeled workload. In various embodiments, workload analysis program 300 stores modified information associated with a modeled workload in database 108.

In an alternative embodiment, workload analysis program 300 provides a user of an application that generated a graph workload a method to analyze the modeled workload and related metadata and WFs so that the metadata and WFs of the graph workload can be optimized and/or the cost associated with different models can be determined.

In step 312, workload analysis program 300 updates the modeled workload. In one embodiment, workload analysis program 300 executes one or more aspects of modeling program 106 to update a model of the graph workload based on the analysis of the modeled workload. Workload analysis program 300 stores the updated graph workload model in database 108. In another embodiment, workload analysis program 300 updates a modeled graph workload based on modifications to the information associated with a modeled workload (step 310). In a further embodiment, workload analysis program 300 updates the modeled workloads, modeled graph workloads, partitions of a graph workload, and/or storage assignments and designations for a modeled graph workload stored in database 108 based on updates to the $f$ function of modeling module 106. Workload analysis program 300 updates one or more modeled graph workloads based on the updated $f$ function of modeling module 106 and stores the updated graph workload model in database 108. In various embodiments, workload analysis program 300 also includes updates to one or more partitions of a graph workload, and/or one or more storage assignments and designations for a modeled graph workload in database 108.

In an alternative embodiment, workload analysis program 300 executes concurrently with WSA program 200 and pauses while analyzing a modeled workload, at step 304. Workload analysis program 300 can respond to a fault within networked computing system 100 that affects the execution of the modeled graph workload and/or the storage of one or more portions of the data utilized by the modeled graph workload. In response to identifying the fault that affects the execution of the modeled graph workload, workload analysis program 300 executes one or more aspects of modeling program 106 to generate an alternative graph workload model, one or more partitions, and one or more storage designations for at least the affected portion of the modeled workload. In some embodiments, workload analysis program 300 includes the alterative graph workload model and associated partitions and/or storage assignments and storage designation to database 108. Workload analysis program 300 can initiate to copy the portion of the data of the graph workload affected by the fault to one or more partitions and/or storage designations of the alternative graph workload model. In other embodiments, workload analysis program 300 communicates with a user of client device 120 to obtain an indication of whether to store the alterative graph workload model and the associated partitions, storage assignments and/or storage designations in database 108.

In summary, various embodiments of the invention provide additional capabilities over the prior art, such as predicting an occurrence of a modeled workload, analyzing a workload based on various metadata and/or data processing environment parameters, and remodeling a graph workload model. Some embodiments of the invention provide the capability to predict a graph workload, and based on analyzing stored modeled workload summaries, identifying a graph workload model representative of the predicted graph workload. Subsequently, embodiments of the invention utilize the identified graph workload model to: partition, allocate, and assign storage designations within a data processing environment for the data used by the predicted graph workload. In addition, embodiments of the invention can preload data and/or data resources used by the predicted graph workload to the assigned storage designations prior to the execution of the modeled graph workload and thereby eliminate the time and effort to model and partition the graph workload. Other embodiments of the invention provide a user the capability to optimize a graph workload model by the modification of metadata and WFs of the data, data resources, and/or constraints associated with the modeled graph workload. A further embodiment of the invention may utilize machine learning to improve the algorithms utilized to model a graph workload.

Figure 4:
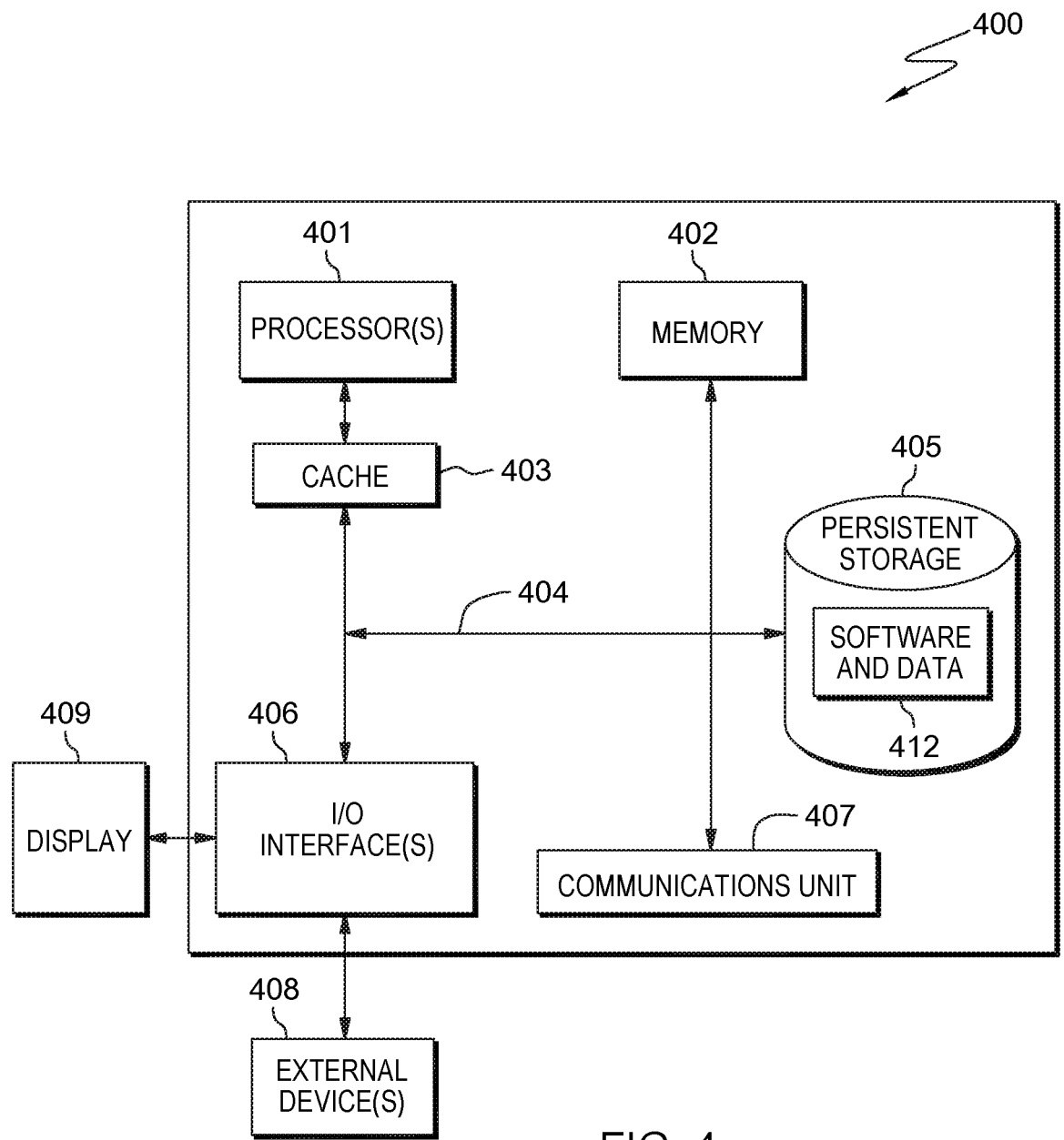
FIG. 4 is a block diagram of components of a computer, in accordance with an embodiment of the present invention.

FIG. 4 depicts a block diagram of computer system 400, which is representative of Server 102, client device 120, data storage 130, computing system 150, and storage system 160. Computer system 400 is an example of a system that includes software and data 412. Computer system 400 includes processor(s) 401, memory 402, cache 403, persistent storage 405, communications unit 407, I/O interface(s) 406, and communications fabric 404. Communications fabric 404 provides communications between memory 402, cache 403, persistent storage 405, communications unit 407, and I/O interface(s) 406. Communications fabric 404 can be implemented with any architecture designed for passing data and/or control information between processors (such as microprocessors, communications and network processors, etc.), system memory, peripheral devices, and any other hardware components within a system. For example, communications fabric 404 can be implemented with one or more buses or a crossbar switch.

Memory 402 and persistent storage 405 are computer readable storage media. In this embodiment, memory 402 includes random access memory (RAM). In general, memory 402 can include any suitable volatile or non-volatile computer readable storage media. Cache 403 is a fast memory that enhances the performance of processor(s) 401 by holding recently accessed data, and data near recently accessed data, from memory 402.

Program instructions and data used to practice embodiments of the present invention may be stored in persistent storage 405 and in memory 402 for execution by one or more of the respective processor(s) 401 via cache 403. In an embodiment, persistent storage 405 includes a magnetic hard disk drive. Alternatively, or in addition to a magnetic hard disk drive, persistent storage 405 can include a solid-state hard drive, a semiconductor storage device, a read-only memory (ROM), an erasable programmable read-only memory (EPROM), a flash memory, or any other computer readable storage media that is capable of storing program instructions or digital information. Storage 104 of server 102 is an example of persistent storage 405.

The media used by persistent storage 405 may also be removable. For example, a removable hard drive may be used for persistent storage 405. Other examples include optical and magnetic disks, thumb drives, and smart cards that are inserted into a drive for transfer onto another computer readable storage medium that is also part of persistent storage 405. Software and data 412 are stored in persistent storage 405 for access and/or execution by one or more of the respective processor(s) 401 via cache 403 and one or more memories of memory 402. With respect to server 102, software and data 412 includes: modeling module 106, database 108, WSA program 200, workload analysis program 300, and various programs that are stored storage 104.

Communications unit 407, in these examples, provides for communications with other data processing systems or devices, including resources of server 102, client device 120, data storage 130, computing system 150, and storage system 160. In these examples, communications unit 407 includes one or more network interface cards. Communications unit 407 may provide communications through the use of either or both physical and wireless communications links. Program instructions and data used to practice embodiments of the present invention may be downloaded to persistent storage 405 through communications unit 407.

I/O interface(s) 406 allows for input and output of data with other devices that may be connected to each computer system. For example, I/O interface(s) 406 may provide a connection to external device(s) 408, such as a keyboard, a keypad, a touch screen, and/or some other suitable input device. External device(s) 408 can also include portable computer readable storage media, such as, for example, thumb drives, portable optical or magnetic disks, and memory cards. Software and data 412 used to practice embodiments of the present invention can be stored on such portable computer readable storage media and can be loaded onto persistent storage 405 via I/O interface(s) 406. I/O interface(s) 406 also connect to display 409.

Display 409 provides a mechanism to display data to a user and may be, for example, a computer monitor. Display 409 can also function as a touch screen, such as the display of a tablet computer or a smartphone.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Additionally, the phrase "based on" should be interpreted to mean "based, at least in part, on."

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for distributing data among storage devices, the method comprising:
   determining, by one or more computer processors, that two or more partitions are representative of a distribution of data utilized by a first graph workload based, at least in part, on a first graph workload model representative of a graph structure of the first graph workload;
   allocating, by one or more computer processors, a plurality of network accessible storage devices of a data processing environment among the two or more partitions; and
   copying, by one or more computer processors, a first set of data packets, of a plurality of data packets utilized during the execution of the first graph workload, to a network accessible storage device.

2. The method of claim 1, wherein the graph structure representative of the first graph workload includes a plurality of nodes:
   wherein a node of the graph structure is representative of one or more data packets of the identified data of the first graph workload;
   wherein one or more nodes of the plurality of nodes further includes metadata associated with the one or more data packets stored on the node; and
   wherein the included metadata of the node is associated with one or more weight factors utilized to create the first graph workload model of the first graph workload.

3. The method of claim 2, wherein the plurality of nodes of the graph structure representative of the first graph workload are linked by a plurality of edges:
   wherein an edge of the graph structure is representative of a relationship between two nodes of the graph workload that are linked by the edge;
   wherein the edge further includes metadata associated with the relationship between the two nodes; and
   wherein the included metadata of the edge is associated with one or more other weight factors utilized to create the first graph workload model of the first graph workload.

4. The method of claim 1:
   wherein the plurality of data packets are assigned among the two or more determined partitions based on the first graph workload model; and
   wherein the first set of data packets is included in a first partition.

5. The method of claim 1, further comprising:
   identifying, by one or more computer processors, a first constraint within metadata corresponding to one or more data packets of the plurality of data packets;
   determining, by one or more computer processors, a second set of data packets that include the identified first constraint from among the plurality of data packets; and
   determining, by one or more computer processors, whether first constraint affects allocating network-accessible storage devices to store the second set of data packets.

6. The method of claim 5, further comprising:
   in response to determining that the first constraint affects allocating network-accessible storage devices for storing the second set of data packets, determining, by one or more computer processors, whether the second set of data packets that include the identified first constraint are distributed among one or more partitions that include data packets that lack the first constraint;
   in response determining that the second set of data packets that include the identified first constraint are included in the first partition in addition to one or more data packets that lack the first constraint, creating, by one or more computer processors, another partition;
   allocating, by one or more computer processors, a set of network accessible storage devices of the data processing environment that comply with the first constraint to the other partition; and
   modifying, by one or more computer processors, the first partition by reassigning the second set of data packets from the first partition to the other partition.

7. The method of claim 6, further comprising:
   creating, by one or more computer processors, another graph workload model representative the first graph workload based on: (i) creating other partition, (ii) modifying the first partition, and (iii) assigning of the second set of data packets to the other partition.

8. A computer program product for distributing data among storage devices, the computer program product comprising:
   one or more computer readable storage media and program instructions stored on the one or more computer readable storage media, the program instructions readable/executable by one or more computer processors:
   program instructions to determine that two or more partitions are representative of a distribution of data utilized by a first graph workload based, at least in part, on a first graph workload model representative of a graph structure of the first graph workload;

program instructions to allocate a plurality of network accessible storage devices of a data processing environment among the two or more partitions; and program instructions to copy a first set of data packets, of a plurality of data packets utilized during the execution of the first graph workload, to a network accessible storage device.

9. The computer program product of claim 8, wherein the graph structure representative of the first graph workload includes a plurality of nodes:

wherein a node of the graph structure is representative of one or more data packets of the identified data of the first graph workload;

wherein one or more nodes of the plurality of nodes further includes metadata associated with the one or more data packets stored on the node; and wherein the included metadata of the node is associated with one or more weight factors utilized to create the first graph workload model of the first graph workload.

10. The computer program product of claim 9, wherein the plurality of nodes of the graph structure representative of the first graph workload are linked by a plurality of edges:

wherein an edge of the graph structure is representative of a relationship between two nodes of the graph workload that are linked by the edge;

wherein the edge further includes metadata associated with the relationship between the two nodes; and wherein the included metadata of the edge is associated with one or more other weight factors utilized to create the first graph workload model of the first graph workload.

11. The computer program product of claim 8:

wherein the plurality of data packets are assigned among the two or more determined partitions based on the first graph workload model; and wherein the first set of data packets is included in a first partition.

12. The computer program product of claim 8, further comprising:

program instructions to identify a first constraint within metadata corresponding to one or more data packets of the plurality of data packets;

program instructions to determine a second set of data packets that include the identified first constraint from among the plurality of data packets; and program instructions to determine whether first constraint affects allocating network-accessible storage devices to store the second set of data packets.

13. The computer program product of claim 12, further comprising:

in response to determining that the first constraint affects allocating network-accessible storage devices for storing the second set of data packets, program instructions to determine whether the second set of data packets that include the identified first constraint are distributed among one or more partitions that include data packets that lack the first constraint;

in response determining that the second set of data packets that include the identified first constraint are included in the first partition in addition to one or more data packets that lack the first constraint, program instructions to create another partition;

program instructions to allocate a set of network accessible storage devices of the data processing environment that comply with the first constraint to the other partition; and modifying, by one or more computer processors, the first partition by reassigning the second set of data packets from the first partition to the other partition.

14. The method of claim 13, further comprising:

program instructions to create another graph workload model representative the first graph workload based on: (i) creating other partition, (ii) modifying the first partition, and (iii) assigning of the second set of data packets to the other partition.

15. A computer system for distributing data among storage devices, the computer system comprising:

one or more computer processors;

one or more computer readable storage media;

program instructions stored on the computer readable storage media for reading/execution by at least one of the one or more computer processors, the program instructions further comprising:

program instructions to determine that two or more partitions are representative of a distribution of data utilized by a first graph workload based, at least in part, on a first graph workload model representative of a graph structure of the first graph workload;

program instructions to allocate a plurality of network accessible storage devices of a data processing environment among the two or more partitions; and program instructions to copy a first set of data packets, of a plurality of data packets utilized during the execution of the first graph workload, to a network accessible storage device.

16. The computer system of claim 15, wherein the graph structure representative of the first graph workload includes a plurality of nodes:

wherein a node of the graph structure is representative of one or more data packets of the identified data of the first graph workload;

wherein one or more nodes of the plurality of nodes further includes metadata associated with the one or more data packets stored on the node; and wherein the included metadata of the node is associated with one or more weight factors utilized to create the first graph workload model of the first graph workload.

17. The computer system of claim 16, wherein the plurality of nodes of the graph structure representative of the first graph workload are linked by a plurality of edges:

wherein an edge of the graph structure is representative of a relationship between two nodes of the graph workload that are linked by the edge;

wherein the edge further includes metadata associated with the relationship between the two nodes; and wherein the included metadata of the edge is associated with one or more other weight factors utilized to create the first graph workload model of the first graph workload.

18. The computer system of claim 15:

wherein the plurality of data packets are assigned among the two or more determined partitions based on the first graph workload model; and wherein the first set of data packets is included in a first partition.

19. The computer system of claim 15, further comprising:

program instructions to identify a first constraint within metadata corresponding to one or more data packets of the plurality of data packets;

program instructions to determine a second set of data packets that include the identified first constraint from among the plurality of data packets; and program instructions to determine whether first constraint affects allocating network-accessible storage devices to store the second set of data packets.

20. The computer system of claim 19, further comprising:

in response to determining that the first constraint affects allocating network-accessible storage devices for storing the second set of data packets, program instructions to determine whether the second set of data packets that include the identified first constraint are distributed among one or more partitions that include data packets that lack the first constraint;

in response determining that the second set of data packets that include the identified first constraint are included in the first partition in addition to one or more data packets that lack the first constraint, program instructions to create another partition;

program instructions to allocate a set of network accessible storage devices of the data processing environment that comply with the first constraint to the other partition; and modifying, by one or more computer processors, the first partition by reassigning the second set of data packets from the first partition to the other partition.

* * * * *